United States Patent
Park et al.

(10) Patent No.: US 7,486,570 B2
(45) Date of Patent: Feb. 3, 2009

(54) FLASH MEMORY DEVICE HAVING REDUCED PROGRAM TIME AND RELATED PROGRAMMING METHOD

(75) Inventors: Dae-Sik Park, Hwaseong-si (KR); Jin-Yub Lee, Seoul (KR); Seong-Kue Jo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 218 days.

(21) Appl. No.: 11/320,975

(22) Filed: Dec. 30, 2005

(65) Prior Publication Data

US 2006/0274582 A1 Dec. 7, 2006

(30) Foreign Application Priority Data

Jun. 3, 2005 (KR) ................................ 2005-47882

(51) Int. Cl.
*G11C 7/10* (2006.01)
(52) U.S. Cl. ............................ 365/189.05; 365/185.17; 365/189.04
(58) Field of Classification Search ............ 365/185.11, 365/226, 185.18, 185.28, 185.17, 189.04, 365/189.14, 189.05
See application file for complete search history.

(56) References Cited

U.S. PATENT DOCUMENTS

| | | | | |
|---|---|---|---|---|
| 5,954,828 | A * | 9/1999 | Lin | 714/723 |
| 6,335,881 | B2 * | 1/2002 | Kim et al. | 365/185.18 |
| 6,366,487 | B1 * | 4/2002 | Yeom | 365/52 |
| 7,064,986 | B2 * | 6/2006 | Lee et al. | 365/185.28 |
| 7,072,238 | B2 * | 7/2006 | Chae et al. | 365/226 |
| 2004/0027856 | A1* | 2/2004 | Lee et al. | 365/185.11 |
| 2004/0264262 | A1* | 12/2004 | Ishimoto et al. | 365/195 |
| 2005/0094478 | A1* | 5/2005 | Hosono et al. | 365/232 |
| 2006/0279994 | A1* | 12/2006 | Park et al. | 365/185.18 |

FOREIGN PATENT DOCUMENTS

| | | |
|---|---|---|
| JP | 2001-229684 | 8/2001 |
| JP | 2003-045192 | 2/2003 |
| KR | 1020010081243 | 8/2001 |
| KR | 1020040004895 | 1/2004 |

* cited by examiner

*Primary Examiner*—Richard Elms
*Assistant Examiner*—Han Yang
(74) *Attorney, Agent, or Firm*—Volentine & Whitt, PLLC

(57) ABSTRACT

Disclosed is a program method for a flash memory device which includes; storing data in a buffer memory and generating a high voltage as a word line voltage. When transmission of data to the buffer memory is complete, the program method simultaneously transfers data in the buffer memory to a page buffer circuit, and programs data in the page buffer circuit in a memory cell array according to the word line voltage.

16 Claims, 4 Drawing Sheets

FLASH MEMORY DEVICE HAVING REDUCED PROGRAM TIME AND RELATED PROGRAMMING METHOD

BACKGROUND OF THE INVENTION

1. Field of the Invention

Embodiments of the invention relates to semiconductor memory devices. In particular, embodiments of the invention relate to flash memory devices and a method of programming flash memory devices.

2. Discussion of Related Art

The development of an ever-widening range of mobile electronic devices and related applications has generated an increasing demand for flash memories and systems adapted to the control and programming of flash memories. Flash memories are particularly well suited to mobile device applications because they are capable of storing a large amount of data in a non-volatile manner. Flash memory is, however, not without its own shortcomings—most notably longer read and write cycles, as compared with random access memories.

However, this particular drawback can be overcome to a certain extent by the use of buffer memories. For example, data from a host device may be first stored in a buffer memory instead of being directly in the flash memory. Thereafter, data initially stored in the buffer memory may be transferred to the flash memory in similar vein, data being read from the flash memory may be first stored in the buffer memory before being transferred to the host device. This buffered mode of data transfer improves the performance of flash memory within memory systems supporting various host devices and related applications.

Conventional flash memory comes in two types; NAND type and NOR type. A NAND flash memory includes a memory cell array adapted to store data. This memory cell array consists of a plurality of cell strings, each referred to as a "NAND string." A page buffer is provided within the NAND flash memory to store data being programmed to the memory cell array or read from the memory cell array. As well known in the art, the memory cells forming a NAND flash memory may be erased and/or programmed using a phenomenon called Fowler-Nordheim tunneling current. Exemplary methods adapted to erase and program a NAND flash memory are disclosed, for example, in U.S. Pat. Nos. 5,473,563 and 5,696,717, the subject matter of which is hereby incorporated by reference.

A flowchart describing a program operation for a conventional flash memory device is illustrated in Figure (FIG.) 1. Referring to FIG. 1, as a program operation commences, the data to be programmed is loaded into a page buffer (S10). After the data to be programmed is loaded into the page buffer, a high voltage generating circuit is activated to generate various voltage signals, such as word line voltages, including a program voltage, a pass voltage, and the like (S20). Once word line voltages reach their target voltages, a program operation is executed. As is conventionally understood, the data loaded in the page buffer is stored in memory cells using iterative program loops. Each of the program loops includes programming memory cells with the loaded data (S30), reading the resulting program states (i.e., verifying the program states) of memory cells (S40), and determining whether the memory cells are programmed to a target (i.e., normal) threshold voltage (S50). The program loop (S30-S50) is run iteratively for a given number of cycles until a defined set of memory cells are all programmed to the target threshold voltage.

The total time required for this program operation is defined by the sum of "data transfer time", (i.e., the time required to transfer data to a page buffer), "high voltage enable time", (i.e., the time required to generate the high voltage signals), and the "program loop time" (i.e., the time required to iteratively run through the program loops). Practically speaking, it is difficult to reduce the data transfer time and the high voltage enable time that occupy most of the total program time. Yet contemporary host devices demand further reductions in the total program time.

SUMMARY OF THE INVENTION

Embodiments of the invention provide a flash memory device and a related program method enabling a reduced total program time.

In one embodiment, the invention provides a program method for a flash memory device comprising a memory cell array, the method comprising; storing data in a buffer memory, upon completion of storing data in the buffer memory, generating a high voltage as a word line voltage, and simultaneously transferring data stored in the buffer memory to a page buffer circuit, and performing a program operation, wherein data in the page buffer circuit is programmed in the memory cell array in accordance with the word line voltage.

In another embodiment, the invention provides a flash memory device comprising; a buffer memory configured to store data, a flash memory core comprising a high voltage generating circuit configured to generate a high voltage as a word line voltage in response to a high voltage enable signal, and a program controller comprising circuitry configured to generate the high voltage enable signal and a data transfer start signal upon determining that transmission of data to the buffer memory is complete, wherein during a period in which the high voltage is being generated, data stored in the buffer memory is transferred to the flash memory core in response to generation of the data transfer start signal.

BRIEF DESCRIPTION OF THE DRAWINGS

Several embodiments of the invention will be described with reference to the accompanying drawings in which like reference symbols indicate the same or similar components, wherein.

DESCRIPTION OF EXEMPLARY EMBODIMENTS

Figure 1:
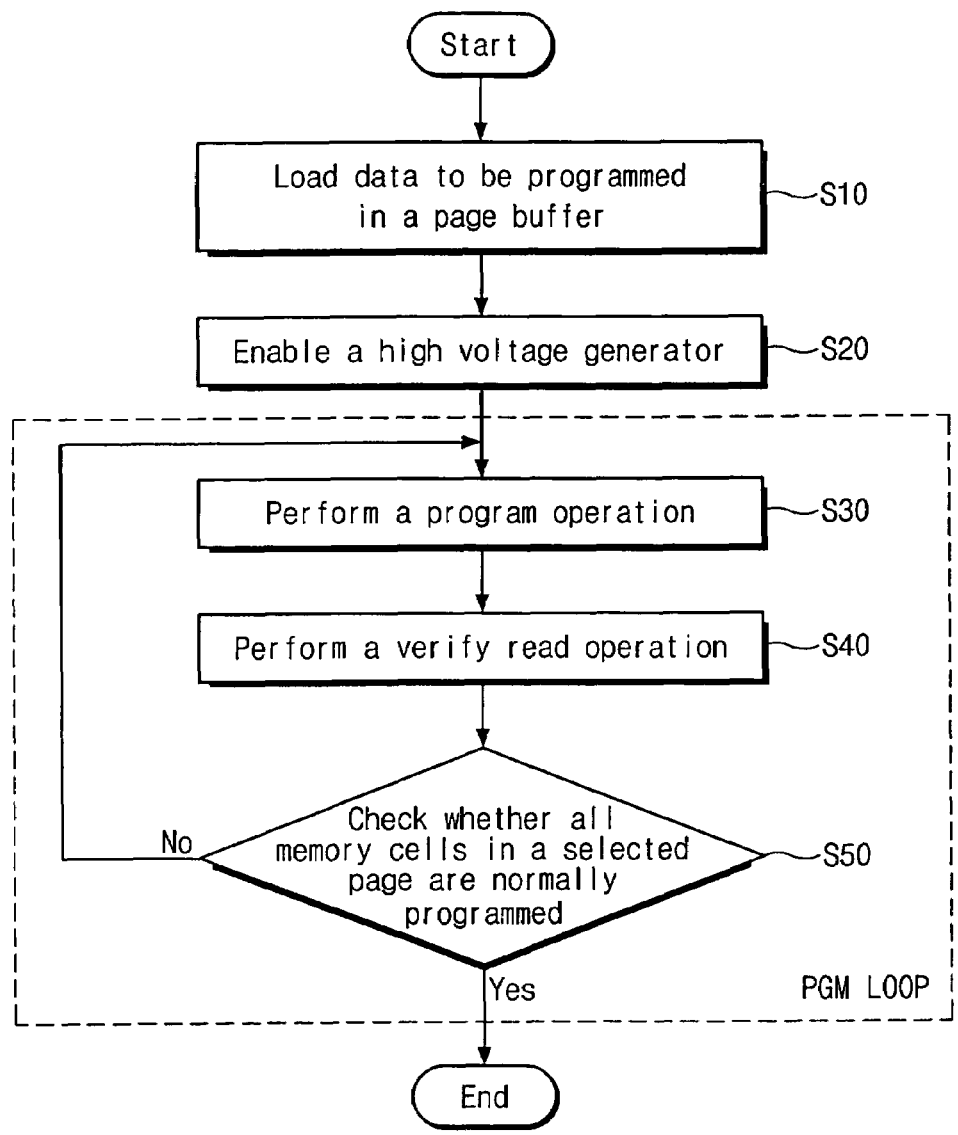
FIG. 1 is a flowchart for describing a program operation for a conventional flash memory device.
Figure 2:
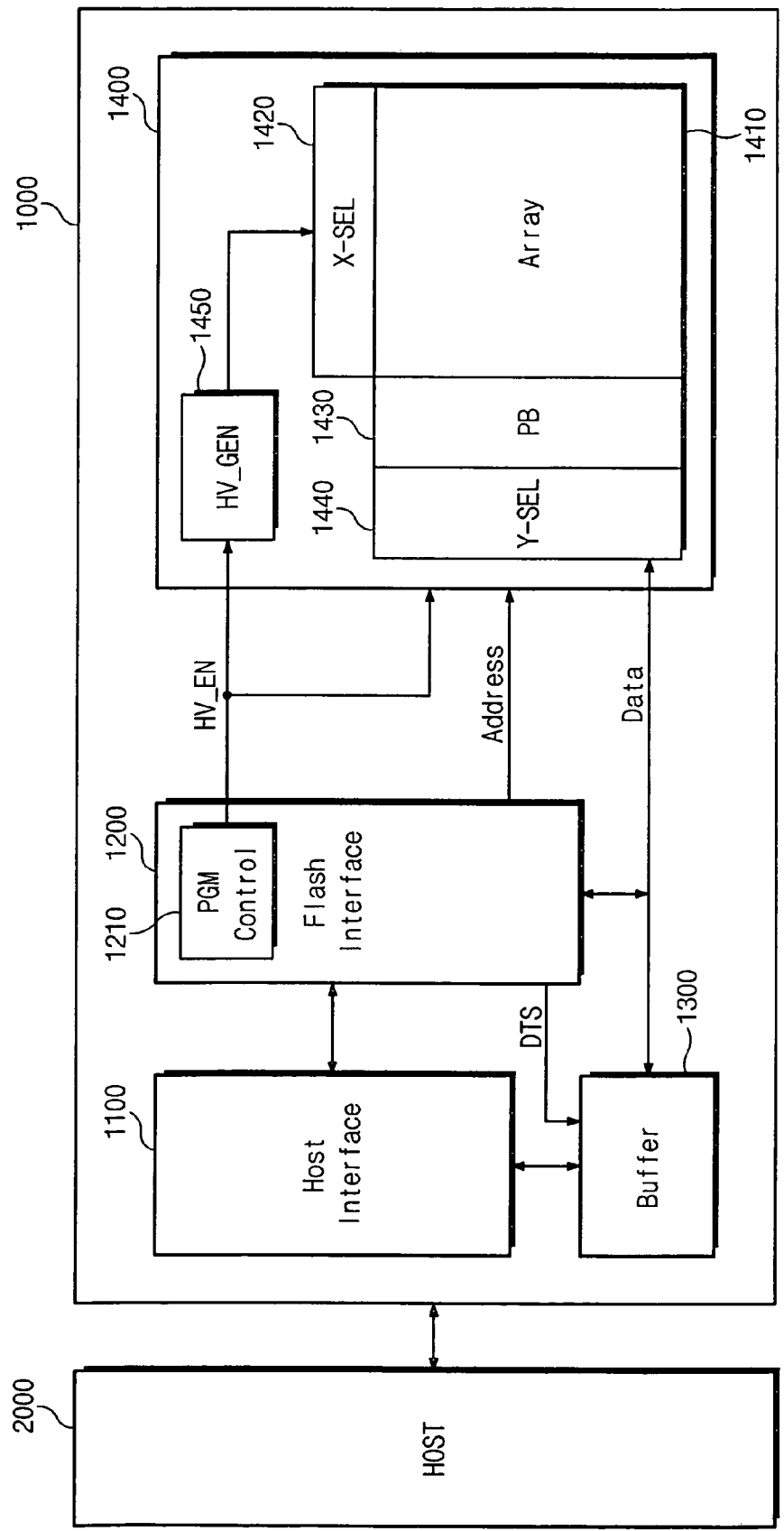
FIG. 2 is a block diagram of a memory system including a flash memory device according to one embodiment of the invention.

FIG. 2 is a block diagram showing a memory system with a flash memory device according to one embodiment of the invention. Referring to FIG. 2, flash memory device 1000 is adapted to store data transferred from a host 2000, and transfer data requested by the host 2000. The flash memory device 1000 comprises a host interface 1100, a flash interface 1200, a buffer memory 1300, and a flash memory core 1400.

The host interface 1100 provides an interface with the host 2000. The flash interface 1200 is adapted to control read and write operations for the flash memory core under the command of the host interface 1100. During a program operation, the buffer memory 1300 temporarily stores data to be programmed in the flash memory core 1400. Data stored in the buffer memory 1300 is transferred to the flash memory core 1400 under the control of the flash interface 1200. During a read operation, the buffer memory 1300 temporarily stores data to be read from the flash memory core 1400, and the host 2000 fetches data stored in the buffer memory 1300.

The flash interface 1200 comprises a program controller 1210, which is adapted to generate control signals for controlling a program operation for the flash memory core 1400. In particular, the program controller 1210 activates a high voltage enable signal HV_EN when transmission of data from the host 2000 to the buffer memory 1300 is completed. The program controller 1210 generates a data transfer start signal DTS when the high voltage enable signal HV_EN is activated. The buffer memory 1300 starts to transfer data to the flash memory core 1400 in response to the data transfer start signal DTS. The program controller 1210 determines whether transmission of data from the buffer memory 1300 to the flash memory core 1400 is complete and whether a predetermined period of time (hereinafter, referred to as a "high voltage setup time") has elapsed sufficient to bring the word line voltage up to its target voltage. Once the high voltage setup time elapses and transmission of data from the buffer memory 1300 to the flash memory core 1400 is complete, the program controller 1210 controls the flash memory core 1400 so that a program operation of the flash memory core 1400 is carried out following the high voltage setup time. In a case where the high voltage setup time has not elapsed and transmission of data from the buffer memory 1300 to the flash memory core 1400 is not complete, the program controller 1210 controls the flash memory core 1400 so that a program operation of the flash memory core 1400 is carried out after transmission of data to the flash memory core 1400 is complete. As described above, an operation (i.e., a high voltage setup operation) for generating a high word line voltage is carried out in parallel with the operation of transferring date from the buffer memory 1300 to the flash memory core 1400.

Continuing to refer to FIG. 2, the flash memory core 1400 comprises a memory cell array 1410, a row selecting circuit 1420 (denoted by "X-SEL"), a page buffer circuit 1430 (denoted by "PB"), a column selecting circuit 1440 (denoted by "Y-SEL"), and a high voltage generating circuit 1450 (denoted by "HV_GEN"). The memory cell array 1410 comprises memory cells (not shown) arranged in rows and columns. In one embodiment, the memory cells may be further arranged in a string structure.

The row selecting circuit 1420 is controlled by the flash interface 1200 and selects one row according to a row address from the flash interface 1200. The page buffer circuit 1430, as is conventionally understood, operates a sense amplifier during a read operation and a write driver during a write/program operation. During a program operation, the page buffer circuit 1430 is adapted to store data provided through the column selecting circuit 1440. During a program operation, the page buffer circuit 1430 and the column selecting circuit 1440 are controlled by the program controller 1210. For example, the high voltage generating circuit 1450 generates word line voltages such as a program voltage, a pass voltage, and the like in response to an activation of the high voltage enable signal HV_EN. The word line voltages are supplied through the row selecting circuit 1420 to the memory cell array 1410. For example, a selected row of a selected memory block is supplied with the program voltage, and unselected rows thereof are supplied with the pass voltage.

As will be understood from the foregoing description, a data transfer operation and a high voltage setup operation are not sequentially carried out, but are carried out in parallel to at least some degree, thus reducing a total program time.

In the foregoing example, flash memory device 1000 is assumed to be a OneNAND flash memory device implemented in a single integrated circuit. That is, the host interface 1100, the flash interface 1200, the buffer memory 130, and the flash memory core 1400 are formed on a single substrate. However, other design choices are susceptible to the teachings above. For example, the host interface 1100, the flash interface 1200, and the buffer memory 1300 may be configured on one integrated circuit, while the flash memory core 1400 may be configured on another integrated circuit.

Figure 3:
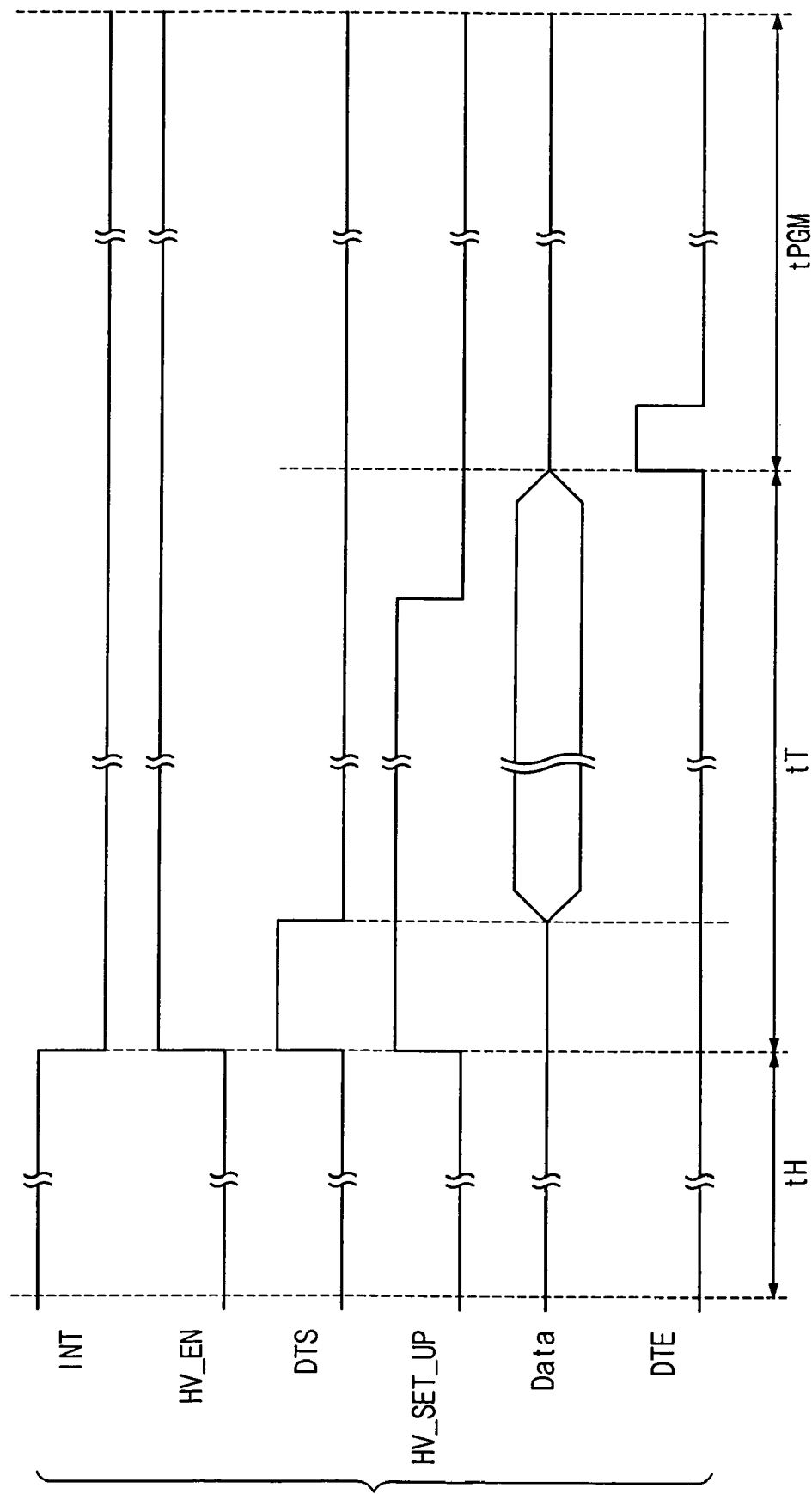
FIGS. 3 and 4 are timing diagrams illustrating an exemplary program operation for the flash memory device illustrated in FIG. 2.

FIG. 3 is a timing diagram illustrating a program operation according to one embodiment of the invention and drawn to the foregoing exemplary flash memory device. In FIG. 3, a "host transfer time" (tH) represents the time needed to transfer data from the host 2000 to the buffer memory 1300. A "buffer transfer time" (tT) represent the time needed to transfer data from the buffer memory 1300 to a page buffer circuit 1430. A "program loop time" (tPGM) represents the time needed to perform a defined plurality of program loops. As described above, to store data in a flash memory device 1000, data is first transferred from the host 2000 to the buffer memory 1300, and then data is transferred from the buffer memory 1300 to the page buffer circuit 1430. Afterward, a program operation for the flash memory core 1400 is carried out as follows.

Firstly, the host 2000 transmits data to be programmed to the flash memory 1000 upon detecting an activated control signal INT (e.g., control signal INT in a logically high state). The transmitted data from the host 2000 is temporarily stored in the buffer memory 1300. Transmission of data from the host 2000 to the buffer memory 1300 is carried out during the host transfer time (tH). Once transmission of data from the host 2000 to the buffer memory 1300 is complete, the control signal INT deactivates (e.g., transitions to a locally low state). At this time, a flash interface 1200 activates a high voltage enable signal HV_EN and a high voltage setup signal HV_SET_UP at the same time. In particular, the flash interface 1200 activates the high voltage enable signal HV_EN and the high voltage setup signal HV_SET_UP at the same time when a program command from the host 2000 is received. A high voltage generating circuit 1450 of a flash memory core 1400 starts to generate a high voltage in response to an activation of the high voltage enable signal HV_EN. The high voltage is generated so as to reach a target voltage within the activated period of the high voltage setup signal HV_SET_UP. The high voltage setup signal HV_SET_UP is a flag signal that is generated in the program controller 1210. The program controller 1210 activates a data transfer start signal DTS simultaneously with an activation of the high voltage setup signal HV_SET_UP.

Once the data transfer start signal DTS deactivates (e.g., transitions from a high to a low state), transmission of data from the buffer memory 1300 to the flash memory core 1400 commences. That is, when the data transfer start signal DTS deactivates, data stored in the buffer memory 1300 is loaded to the page buffer circuit 1430 through a column selecting circuit 1440 of the flash memory core 1400 according to a given unit size (e.g., ×8, ×16, ×32, etc.). During loading of data to the page buffer circuit 1430, the program controller 1210 determines whether a high voltage setup time elapses and whether transmission of data to the page buffer circuit 1430 is complete. In a case where the high voltage setup time elapses and transmission of data to the page buffer circuit 1430 is not complete, the data transfer operation continues. In a case where the high voltage setup time elapses and transmission of data to the page buffer circuit 1430 is complete, the program controller 1210 internally generates a data transfer end signal DTE that is a flag signal internally generated in the program controller 1210. Optionally, error-correction code (ECC) data may be conventionally generated by flash interface 1200 when data is transferred to the page buffer circuit 1430. The ECC data thus generated is loaded to the page buffer circuit 1430.

Figure 4:
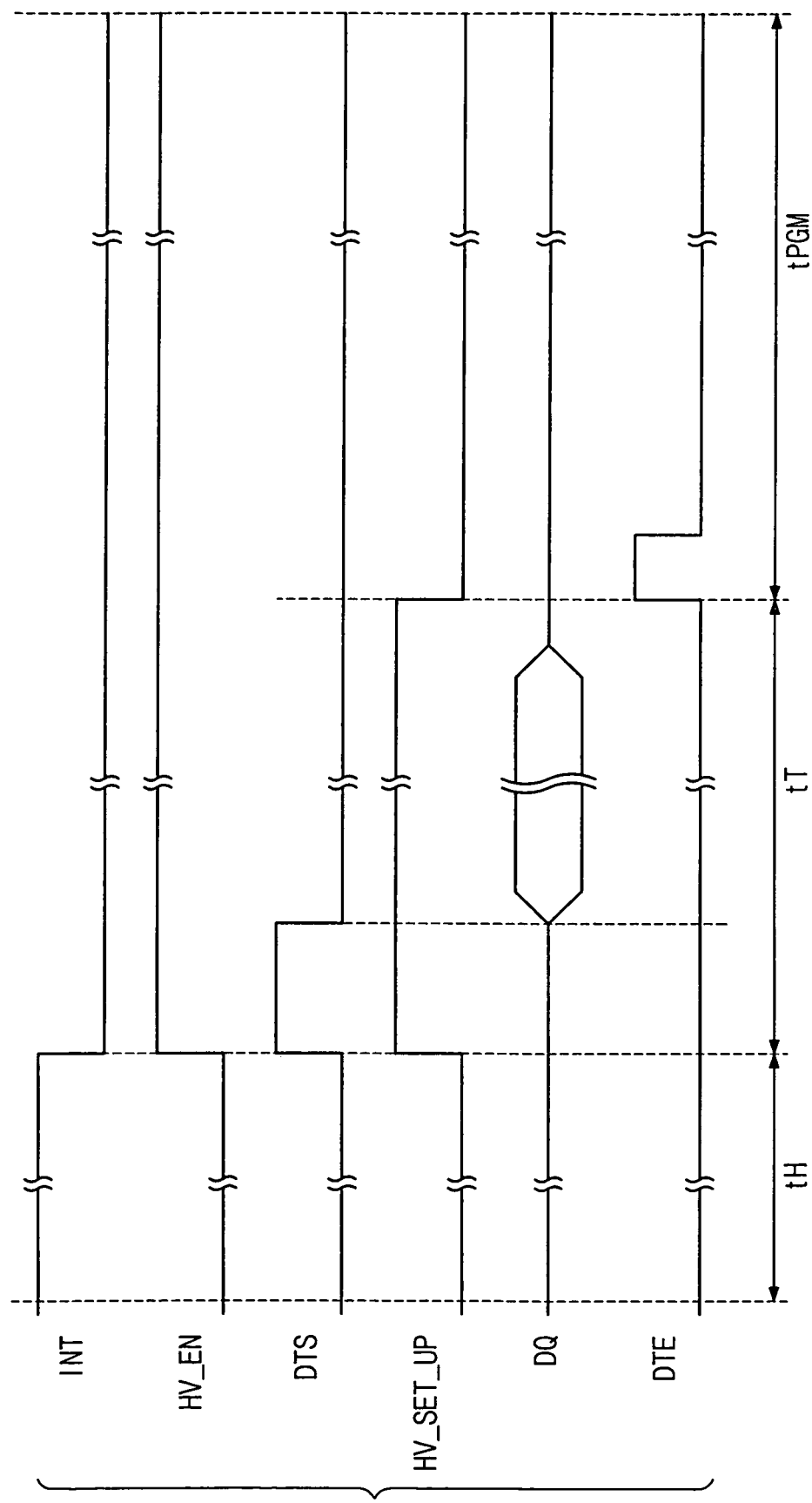

If a data transfer operation is completed during a high voltage setup interval (e.g., activation of the high voltage setup signal HV_SET_UP), as illustrated for example in FIG. 4, the program controller 1210 waits until the high voltage setup time elapses. In this case, the program controller 1210 internally generates the data transfer end signal DTE when a data transfer operation is complete. That is, in the case that a data transfer operation is complete and the high voltage setup time elapses, the program controller 1210 internally generates the data transfer end signal DTE. As the data transfer end signal DTE is activated, data loaded to the page buffer circuit 1430 will be programmed in the memory cell array 1410 using conventionally understood techniques under the control of the program controller 1210.

As illustrated in FIGS. 3 and 4, the total program time can be reduced by performing the operation for generating a high voltage during the buffer transfer time period (tT).

As shown in FIGS. 3 and 4, the present invention is implemented such that transmission of data to the page buffer circuit 1430 is not carried out simultaneously with an activation of a high voltage enable signal HV_EN. That is, the buffer memory 1300 starts to transfer data to the page buffer circuit 1430 in response to deactivation (e.g., a high-to-low transition) of the data transfer start signal DTS. This prevents data from being changed when a power is consumed during an initial operation interval for the high voltage generating circuit 1450.

The invention has been described in relation to several exemplary embodiments. However, it is to be understood that the scope of the invention is not limited to only the disclosed embodiments. On the contrary, it is intended to cover various modifications and similar arrangements. The scope of the invention, therefore, should be accorded the broadest interpretation so as to encompass all such modifications and similar arrangements consistent with the following claims.

What is claimed is:

1. A program method for a flash memory device comprising a high voltage generator circuit generating a word line voltage, and a flash memory core including a page buffer circuit and a memory cell array, the method comprising:
    storing data in a buffer memory external to the flash memory core;
    upon completion of storing data in the buffer memory, generating a high voltage enable signal to activate the high voltage generator circuit, and simultaneously transferring the data stored in the buffer memory to the page buffer circuit; and
    performing a program operation, wherein the data stored in the page buffer circuit is programmed in the memory cell array in accordance with the word line voltage.

2. The program method of claim 1, wherein the high voltage generator circuit generates the word line voltage at a target voltage during a high voltage setup interval, and the method further comprising:
    determining whether the high voltage setup interval has elapsed and whether transfer of the data from the buffer memory to the page buffer circuit is complete; and,
    thereafter performing the program operation.

3. The program method of claim 2, wherein the program operation is performed only after the high voltage setup interval elapses and the transfer of the data from the buffer memory to the page buffer circuit is complete.

4. The program method of claim 3, wherein the program operation is performed only after the transfer of the data from the buffer memory to the page buffer circuit is complete and the word line voltage reaches the target voltage.

5. The program method of claim 1, wherein the data is transferred from the buffer memory to the page buffer circuit only after the storing of the data to the buffer memory is complete, and only after the high voltage setup interval has elapsed.

6. A flash memory device comprising:
    a buffer memory configured to store data received from a host;
    a flash memory core comprising a page buffer circuit and a high voltage generating circuit configured to generate a high voltage as a word line voltage in response to a high voltage enable signal; and
    a program controller comprising circuitry configured to simultaneously generate the high voltage enable signal and a data transfer start signal upon determining that transmission of data from the host to the buffer memory is complete,
    wherein during a setup interval in which the high voltage is being generated, data stored in the buffer memory is transferred to the page buffer circuit in response to generation of the data transfer start signal.

7. The flash memory device of claim 6, wherein the program controller circuitry is further configured to determine whether the high voltage has reached a target voltage and whether transmission of data to the flash memory core is complete.

8. The flash memory device of claim 7, wherein the flash memory core is configured to be programmed when the high voltage reaches the target voltage and the transmission of data to the flash memory core is complete.

9. The flash memory device of claim 7, wherein the flash memory core is configured to be programmed only after the high voltage reaches the target voltage.

10. The flash memory device of claim 6, wherein the program controller is further configured to control transmission of data to the flash memory core following activation of the high voltage generating circuit and once the setup interval for the high voltage has elapsed.

11. The flash memory device of claim 6, wherein the flash memory core comprises:
    an array of memory cells arranged in rows and columns;
    a row selecting circuit adapted to control by the program controller and configured to select one of the rows and drive the selected row with the word line voltage; and
    a column selecting circuit adapted to control by the program controller and configured to transfer data from the buffer memory to the page buffer circuit.

12. The flash memory device of claim 6, wherein the flash memory device is an OneNAND flash memory device, such that the buffer memory, the program controller, and the flash memory core are implemented on a single chip.

13. A program method for a flash memory device comprising a high voltage generator circuit generating a word line voltage, and a flash memory core including a memory cell array and a page buffer circuit, wherein the, the method comprising:

transferring data from a host to a buffer memory external to the flash memory core and storing the data in the buffer memory device;

following transfer of the data from the host to the buffer memory, generating a high voltage enable signal to activate the high voltage generator circuit and transferring the data stored in the buffer memory to the page buffer circuit, wherein generation of the high voltage enable signal starts a high voltage setup interval during which the word line voltage reaches a target voltage, and wherein the transfer of the data from the buffer memory to the page buffer circuit is performed at least partially during the high voltage setup interval; and after the high voltage setup period has elapsed and the data transfer from the buffer memory to the page buffer circuit is complete, performing a program operation, wherein the data transferred to the page buffer is programmed in the memory cell array using the word line voltage.

14. The program method of claim 13, wherein generation of the high voltage enable signal and start of the transfer of the data from the buffer memory to the page buffer circuit begin simultaneously.

15. The program method of claim 14, wherein performing the program operation is begun only after receiving an indication that transfer of the data from the buffer memory to the page buffer circuit is complete and receiving an indication that the word line has reached the target.

16. The program of claim 15, wherein transfer of the data from the memory buffer to the page buffer circuit comprises:

activating a data transfer signal following transfer of the data from the host to the buffer memory and then deactivating the data transfer signal following a defined delay period; and transferring the data from the memory buffer to the page buffer circuit upon deactivation of the data transfer signal.

* * * * *